US 6,512,681 B2

(12) United States Patent
Uusimäki

(10) Patent No.: US 6,512,681 B2
(45) Date of Patent: Jan. 28, 2003

(54) METHOD AND ARRANGEMENT FOR IMPLEMENTING EMC SHIELDING IN ELECTRONIC DEVICE, AND CIRCUIT BOARD OF ELECTRONIC DEVICE

(75) Inventor: Matti Uusimäki, Sahalahti (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/752,264

(22) Filed: Dec. 29, 2000

(65) Prior Publication Data
US 2001/0006458 A1 Jul. 5, 2001

(30) Foreign Application Priority Data
Dec. 31, 1999 (FI) .............................. 19992852

(51) Int. Cl.⁷ ................................. H05K 9/00
(52) U.S. Cl. ..................... 361/816; 361/777; 361/799; 361/818; 174/35 R; 174/51
(58) Field of Search ................. 361/800, 816, 361/818, 799, 748, 751, 772, 777, 803; 174/35 R, 35 MS, 35 GC, 51, 255, 261

(56) References Cited

U.S. PATENT DOCUMENTS

| | | | | |
|---|---|---|---|---|
| 3,885,173 A | * | 5/1975 | Lee ........................ 310/313 B |
| 4,831,498 A | * | 5/1989 | Baba ..................... 174/35 GC |
| 5,014,160 A | * | 5/1991 | McCoy, Jr. ............ 174/35 GC |
| 5,237,235 A | * | 8/1993 | Cho et al. .................. 29/25.35 |
| 5,252,782 A | * | 10/1993 | Cantrell et al. ........... 174/35 R |
| 5,550,713 A | * | 8/1996 | Pressler et al. ............. 361/818 |
| 6,049,468 A | * | 4/2000 | Learmonth ............ 174/35 GC |
| 6,137,693 A | * | 10/2000 | Schwiebert et al. ........ 361/803 |
| 6,157,546 A | * | 12/2000 | Petty et al. ................. 361/816 |

FOREIGN PATENT DOCUMENTS

| | | |
|---|---|---|
| CH | 572698 | 2/1976 |
| DE | 29622830 U1 | 10/1997 |
| EP | 0639940 A1 | 2/1995 |
| JP | 11052027 | 2/1999 |

* cited by examiner

Primary Examiner—Jayprakash N. Gandhi
(74) Attorney, Agent, or Firm—Perman & Green, LLP

(57) ABSTRACT

A method for improving the EMC shielding of an electronic device, according to which method, the electromagnetic interference caused by a floating signal line routed across a circuit board of the device is reduced by placing an electrically conductive shielding structure of the device on the circuit board so that the shielding structure connects the floating signal line to a potential area on the circuit board. An arrangement used with an electronic device, in which arrangement a floating signal line routed across a circuit board is connected to a potential area of the circuit board by means of an electrically conductive shielding structure arranged to the circuit board. A circuit board of an electronic device, which comprises a floating signal line routed at least partly at the same location as a potential area.

42 Claims, 2 Drawing Sheets

METHOD AND ARRANGEMENT FOR IMPLEMENTING EMC SHIELDING IN ELECTRONIC DEVICE, AND CIRCUIT BOARD OF ELECTRONIC DEVICE

BACKGROUND OF THE INVENTION

1. Field of the Invention

The invention relates to a method for implementing EMC shielding in an electronic device, according to which method, the electromagnetic interference caused by at least one floating signal line routed across a circuit board of the device is reduced by shielding the circuit board with an electrically conductive shielding structure of the device by placing the shielding structure on a potential area on the circuit board.

The invention further relates to an arrangement used with an electronic device, which arrangement-comprises a circuit board of the device having at least one floating signal line routed across the circuit board and a potential area arranged on the circuit board, which arrangement further comprises an electrically conductive shielding structure of said device placed on the potential area.

The invention also relates to a circuit board of an electronic device, having at least one floating signal line routed across the circuit board and a potential area.

2. Brief Description of Related Developments

The increase in electronic devices, such as mobile phones, portable computers and corresponding devices, has created a need to attach more and more attention to reducing the electromagnetic interference caused by the devices in question, and to the electromagnetic interference tolerance of said devices, because the same device can both generate interfering electromagnetic radiation and be sensitive to electromagnetic interference. To improve the electromagnetic shielding, i.e. EMC shielding, devices causing interference or sensitive to interference, or their components, are shielded With at least partly electrically conductive shielding structures. For instance, to shield a component or component group which resides on the circuit board of an electronic device and causes electromagnetic interference, the component or component group in question can be surrounded by an area connected to a ground potential, and an electrically conductive protective casing or housing is arranged to it to enclose the components. The joint between the circuit board surface and the protective casing can be sealed with an electrically conductive gasket. The purpose of the protective casing is to prevent electromagnetic interference from radiating outside the casing, and also to shield the components inside the casing from outside interference. A great number of such protective casings and gaskets exist in various materials, shapes, electrical conductivity and other properties, and they are known per se to a person skilled in the art. Even the entire circuit board can be enclosed inside such a protective casing, as is done with mobile phones, for instance, in that the circuit board of the mobile phone is enclosed inside the frame and the casing of the phone, which act as a protective casing.

A known electronic device has a circuit board panel and both ends of the panel comprise edges between which the actual circuit board resides and which will be cut off at a certain stage of assembly. A system connector of the device is installed at one end of the circuit board in the area of the actual circuit board. Measurement points required for testing the operation of the circuit board are installed at the opposite end of the circuit board, on the edge of the panel. Test signal lines required for the testing have been routed between the system connector and the measurement points. After the circuit board has been tested, the edges at both ends of the panel are cut off and the cut-off test signal lines attached to the system connector at one end remain in a floating potential. Such a floating test signal line acts as an antenna and may collect both conducted and radiated electromagnetic interference from the system connector to the device and from inside the device to the system connector cables. This problem not only arises in connection with system connectors, but a corresponding problem occurs in general in any connector, having signals to be tested and attached to a circuit board, when the connector and a measurement point reside substantially on opposite edges of the circuit board or circuit board panel and floating signal lines are formed on the circuit board at some stage of the assembly. These connectors include board-to-board connectors coupling two circuit boards together, RF connectors and the like.

In another known solution, the test signal lines between the system connector and the measurement points are routed partly through the edge to be cut off from the panel on the system connector side in such a manner that when the panel edges are cut off from the actual circuit board, the direct connection between the test signal line and the system connector is cut. This solution removes problems caused possibly by conducted electromagnetic interference, but the part of the test signal line that remains floating still acts as an antenna and may collect radiated electromagnetic interference.

The object of this invention is to improve the EMC shielding of electronic devices.

SUMMARY OF THE INVENTION

The method of the invention is characterized in that during an assembly stage of a device, a shielding structure is placed at least partly oh a floating signal line in such a manner that the shielding structure connects the floating signal line to the potential area.

Further, the arrangement of the invention is characterized in that the shielding structure is placed at least partly on top of the floating signal line in such a manner that the shielding structure connects the floating signal line to the potential area.

Further, the circuit board of the invention is characterized in that the floating signal line is routed at least partly at substantially the same location as the potential area in such a manner that the shielding structure of the electronic device can at an assembly stage be arranged to the circuit board so that the shielding structure connects the floating signal line to the potential area.

The essential idea of the invention is that to improve the EMC shielding of an electronic device having an electrically conductive shielding structure and a circuit board having at least one floating signal line routed across the circuit board and a potential area, the floating signal line is at an assembly stage connected to the potential area by means of a shielding structure arranged to the circuit board in such a manner that said shielding structure of the device connects the floating signal line to the potential area. In a preferred embodiment of the invention, the shielding structure connecting the floating signal line to the potential area is the frame of the device. In a second preferred embodiment of the invention, the shielding structure has at least one part protruding inward in the shielding structure, and through this protruding part, the floating signal line is connected to the potential area. In a third preferred embodiment of the invention, the electronic device has between the potential area of the circuit board and the shielding structure of the device a gasket which connects the floating signal line to the potential area.

The invention provides the advantage that radiated electromagnetic interference, too, is reduced, and consequently, the device causes less interference to its environment and is also more interference-tolerant. Further, the operation of the device during electromagnetic interference can be better predicted. Implementing the invention also causes no additional costs.

BRIEF DESCRIPTION OF THE DRAWINGS

The invention will be described in greater detail by means of the attached drawings in which.

DETAILED DESCRIPTION OF THE PREFERRED EMBODIMENT(s)

Figure 1:
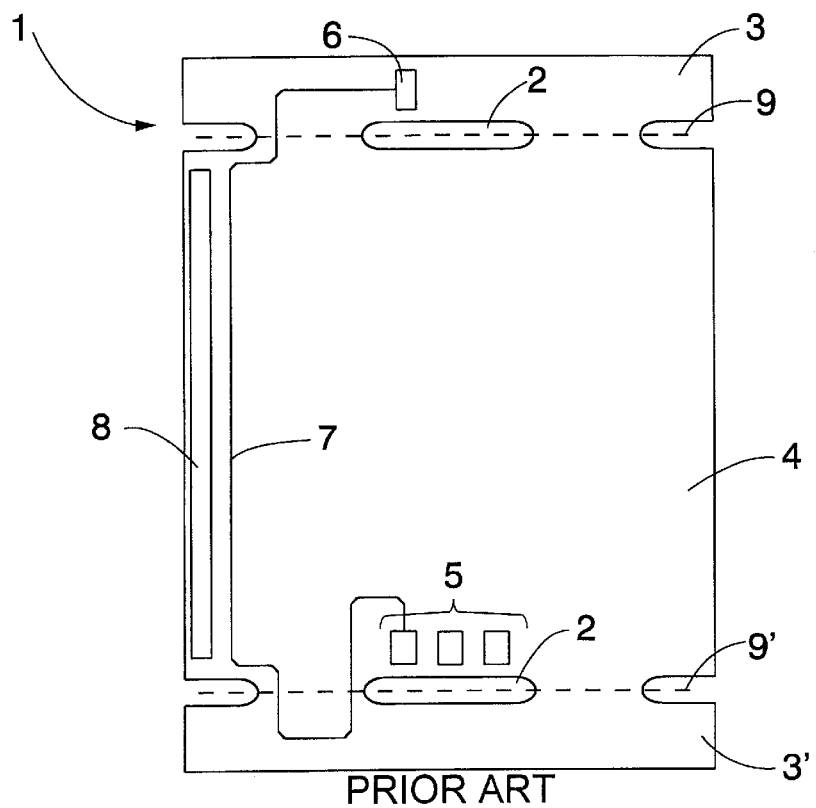
FIG. 1 is a schematic of a prior art embodiment of a circuit board panel.

FIG. 1 shows a schematic of a prior art circuit board panel 1. The circuit board 4 is arranged to the circuit board panel 1 so that the circuit board 4 is between perforations 2 made through the circuit board panel 1. In the following, the circuit board panel 1 is referred to as panel 1. A system connector 5 of an electronic device is arranged at one end of the circuit board, in the case shown in FIG. 1, this is the bottom end. A measurement point 6 is arranged at the opposite end of the panel 1 in relation to the system connector 5 and in the area of the first edge 3 of the panel 1. There can be more than one measurement point 6. For clarity's sake, FIG. 1 does not show any other components on the circuit board 4. A test signal line 7 is routed between the system connector 5 and the measurement point 6 for testing the operation of the circuit board 4. The signal line 7 is routed across the circuit board 4 between the system connector 5 and the measurement point 6 in such a manner that the signal line 7 is routed through the second edge 3' of the panel 1 at end on the system connector 5 side. A potential area 8 is also arranged on the circuit board 4. The location of the potential area 8 on the circuit board 4 is not substantially limited, but it is preferably on the edge of the circuit board 4.

After the circuit board 4 has been tested, the edges 3 and 3' of the panel are at an assembly state cut off the panel 1 at the perforations 2 according to the cut lines 9 and 9', which makes the part of the test signal line 7 that is routed across the circuit board 4 floating, i.e. it is not connected to any voltage potential. Since said part of the test signal line 7 has no conducted connection to the system connector 5, said part of the test signal line 7 does not cause conducted electromagnetic interference from inside the device to the system connector 5 or vice versa. Said part of the test signal line 7 acts, however, as an antenna and collects radiated electromagnetic interference to it. The part of the test signal line 7 that is still attached to the system connector 5 is instead typically so short that the interference it causes is minimal.

Figure 2:
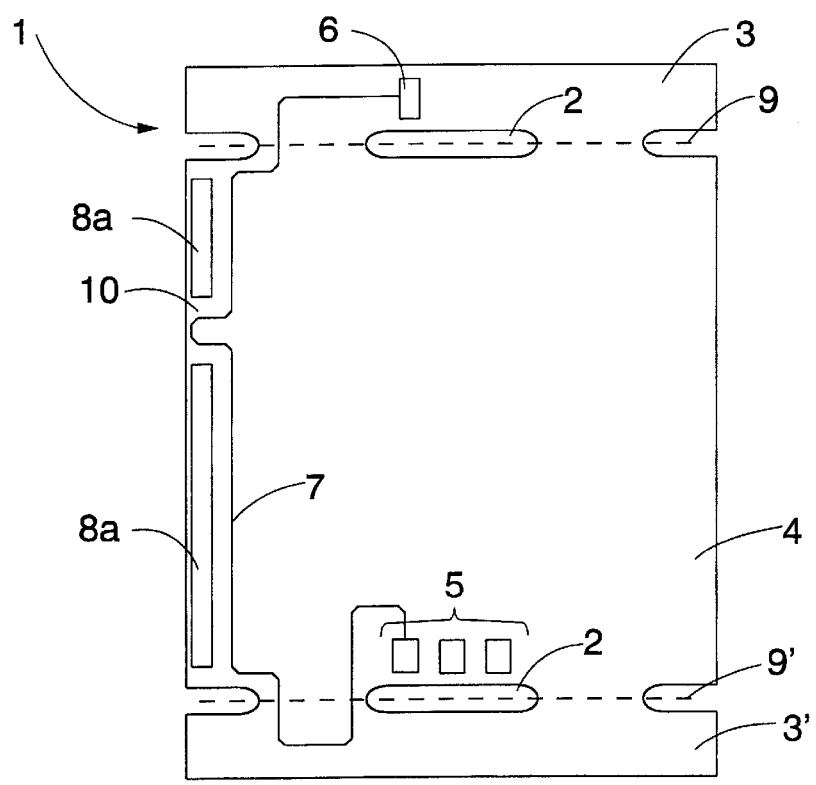
FIG. 2 is a schematic of an embodiment of a circuit board panel of the invention.

FIG. 2 is a schematic of a circuit board panel 1 of the invention. FIG. 2 shows a potential area 8a or a certain potential area 8a on the circuit board 4 and how it is cut from the cut-off point 10 and how the test signal line 7 between the system connector 5 and the measurement point 6 is routed through the cut-off point 10 of the potential area 8a. The test signal line 7 is thus at least partly routed at substantially the same location as the potential area 8a. Differing from FIG. 2, there may be more than one cut-off point 10 of the potential area 8a, and the test signal line 7 can be routed through all these cut-off points 10. The voltage level of the potential area 8a is preferably zero volt, i.e. the potential area is a ground potential-area. The voltage level of the potential area can also be chosen to be different from zero volt.

In FIG. 2, the potential area 8a on the circuit board 4 is arranged to the left edge of the circuit board 4. The potential area 8a can also be made on the edge of the circuit board 4 in such a manner that it surrounds the entire circuit board 4.

Figure 3:
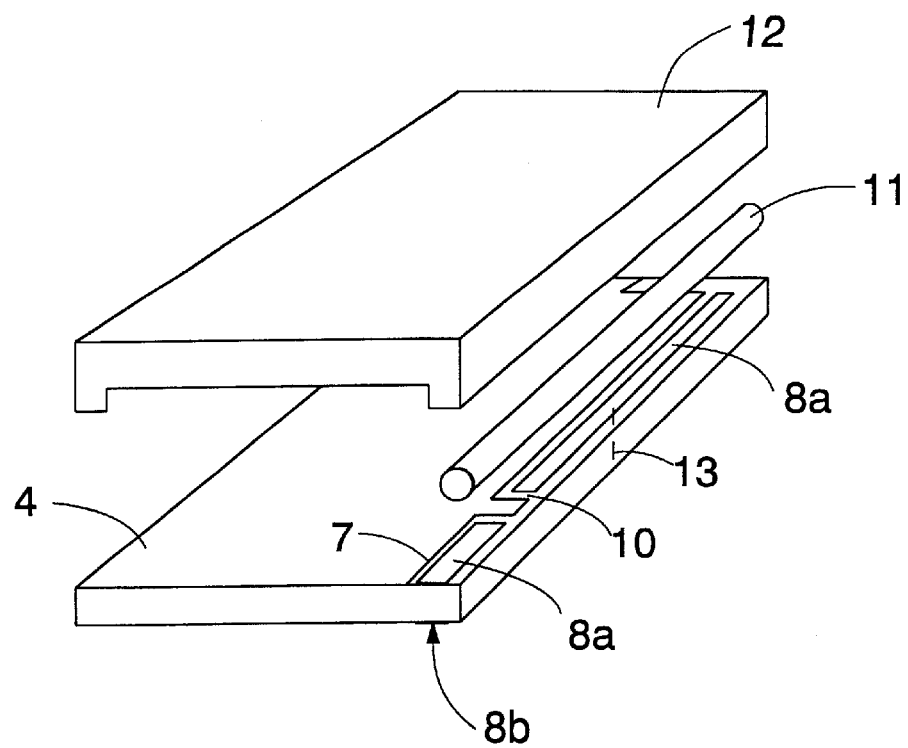
FIG. 3 is a schematic of an arrangement of the invention used with an electronic device, as a perspective scatter diagram.

FIG. 3 is a schematic of an arrangement of the invention used with an electronic device, as a perspective scatter diagram. FIG. 3 shows the circuit board 4 of FIG. 2 after the edges 3 and 3' of the panel 1 have been cut off. An electrically conductive gasket 11 arranged at an assembly stage of the electronic device between the cut off potential area 8a of the circuit board 4 and an electrically conductive shielding structure 12 of the device, which gasket 11 is preferably made of an elastomer compounded to be electrically conductive, for instance, is arranged between the potential area 8a of the circuit board 4 and the shielding structure 12 in such a manner that the gasket 11 connects the part of the test signal line 7 that is routed across the circuit board 4 to the potential area 8a, thus grounding said test signal line 7, if the voltage level of the potential area is zero volt. At the same time, the gasket 11 also connects said part of the test signal line 7 to the shielding structure 12 of the device. Further, the gasket 11 connects the various parts of the potential area 8a, formed when the potential area 8a is cut, to each other short-circuiting the potential area 8a. The gasket 11 can also itself form a shielding structure 12. Even though the gasket 11 shown in FIG. 3 is only on one edge of the circuit board 4, it is clear that it can also be arranged on other edges of the circuit board 4 between the circuit board 4 and the shielding structure 12.

According to the invention, the part of the test signal line 7 that is routed across the circuit board 4 in FIG. 3 can be connected to the potential area 8a solely through the electrically conductive shielding structure 12 of the device, and the gasket 11 can be left out from between the circuit board 4 and the shielding structure 12. The gasket 11 can also be integrated to be a part of the shielding structure 12, or an elastic, electrically conductive material can be used in the shielding structure 12 so that it seals the joint between the circuit board 4 and the shielding structure 12.

In the embodiment shown in FIG. 3, there is a second potential area 8b or a second certain potential area 8b on the opposite side of the circuit board 4 in relation to the potential area 8a, and the second potential area 8b can also be arranged to surround the entire circuit board 4. It is further possible to join the potential areas 8a and 8b together by means of at least one plane block 13 routed through the circuit board 4 and illustrated with a dashed line. Then, the gasket 11 connects the part of the test signal line 7, which was earlier made floating, not only to the potential area 8a on the same side as the test signal line 7, but also through the plane block 13 to the potential area 8b on the opposite side of the circuit board 4 and on to a second shielding structure possibly arranged on the potential area 8b side of the circuit board 4. There may be more than one plane blocks 13 routed through the circuit board 4. It is also possible to design the shielding structure 12 of the device and the gasket 11 so that either the shielding structure 12 or the gasket 11 or both together connect the potential areas 8a and 8b on the different sides of the circuit board 4 to each other.

Figure 4:
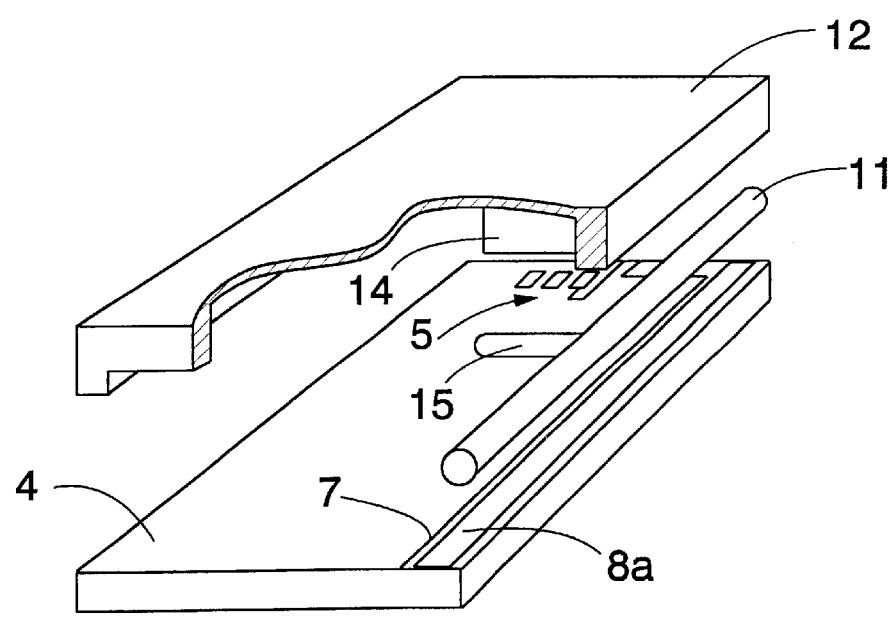
FIG. 4 is a schematic of a second arrangement of the invention used with an electronic device, as a perspective scatter diagram and in partial cross-section.

FIG. 4 is a schematic of a second arrangement of the invention used with an electronic device, as a perspective scatter diagram and in partial cross-section. In this embodiment, the shielding structure 12 of the device comprises a part 14 protruding inward in the shielding structure 12, whereby a protruding part 15 of the gasket 11 arranged, at an assembly stage of the electronic device, between the circuit board 4 and the protruding part 14 connects the part of the test signal line 7 that is routed across the circuit board 4 to the potential area 8a of the circuit board 4. It is then not necessary to form a cut-off point 10 to the potential area 8a, but it is enough that the test signal line 7 is arranged to run at least partly at the location of the protruding part 14, preferably in the immediate vicinity of the potential area 8a. It is also possible to make several protruding parts 14 to the shielding structure 12, through which protruding parts, the part of the test signal line 7 that is routed through the circuit board 4 can be connected at several locations to the potential area by forming several protruding parts 15 in the gasket 11. The shape and location of the protruding part 14 in the shielding structure 12 may freely vary, the only essential thing is that the gasket 11 attached to the protruding part 14 or the protruding part 15 of the gasket 11 connects the floating test signal line 7 to the potential area 8a. Further, it is also possible to connect the part of the test signal line 7 routed across the circuit board 4 in FIG. 4 to the potential area 8a solely through the electrically conductive shielding structure 12 of the device, whereby the gasket 11 can be left out from between the circuit board 4 and the shielding structure 12.

In the embodiments shown in FIGS. 3 and 4, the electrically conductive shielding structure 12 of the electronic device can, for instance, be the frame or casing of the device. Further, it is completely clear that it is possible to use any part used at an assembly stage of the device as the shielding structure 12 connecting the test signal line 7 to the potential area 8a, whereby it is essential to the part in question that it is at least partly electrically conductive and that it connects the test signal line 7 to the potential area 8a.

The drawings and the related description are only intended to illustrate the idea of the invention. The invention may vary in detail within the scope of the claims. Thus, the structures and dimensions shown in the figures may vary in size and shape, as may the way the circuit board 4, gasket 11 and shielding structure 12 are attached to each other. Material selection for the gasket 11 and shielding structure 12 of the device, as well as the technical solutions on how the gasket 11 and shielding structure 12 are made electrically conductive, may freely vary, the only essential thing is that the gasket 11 and shielding structure 12 are made at least partly electrically conductive. The number of signal lines to be grounded is also not limited. It is also completely clear that the signal line 7 must be on the surface of the circuit board 4 specifically at the location where the signal line 7 is connected to the potential area. Elsewhere on the circuit board 4, said signal line 7 can be routed on any layer of the circuit board 4. In addition, it is clear that the signal line 7 can also be on the opposite side of the circuit board 4 with respect to the potential area 8a, in which case the signal line 7 can be connected to the potential area 8a on the opposite side of the circuit board 4 through a suitably shaped shielding structure 12, for instance. The potential area 8a and the signal line 7 are, however, preferably on the same side of the circuit board 4. The measurement point 6 may, for instance, be a test switch or some other corresponding measurement point. The system connector 5 can also be a board-to-board connector connecting two circuit boards 4 to each other, an RF connector or another corresponding connector. The signal line to be connected to the certain potential area 8a need also not be a test signal line 7, but it can be a signal line between two circuit boards 4 or some other floating signal line.

What is claimed is:

1. An arrangement used with an electronic device, which arrangement comprises a circuit board of the device, having at least one floating signal line routed across the circuit board and a potential area arranged on the circuit board, which arrangement further comprises an electrically conductive shielding structure of said device placed on the potential area and at least partly on top of the floating signal line in such a manner that the shielding structure connects the floating signal line to the potential area.

2. An arrangement as claimed in claim 1, wherein the floating signal line and the potential area are on the same side of the circuit board.

3. An arrangement as claimed in claim 1, wherein the potential area is arranged on the edge of the circuit board.

4. An arrangement as claimed in claim 1, wherein the potential area is arranged to substantially surround the entire circuit board.

5. An arrangement as claimed in claim 1, wherein the potential area has at least one cut-off point through which the floating signal line is routed.

6. An arrangement as claimed in claim 1, wherein the floating signal line is a test signal line.

7. An arrangement as claimed claim 1, wherein the shielding structure is made of an at least partly elastic material.

8. An arrangement as claimed in claim 1, wherein the arrangement further comprises a gasket which is at least partly electrically conductive and that the potential area is connected to the shielding structure of the device with the gasket.

9. An arrangement as claimed in claim 8, wherein the gasket is made of an at least partly elastic material.

10. An arrangement as claimed in claim 8, wherein the shielding structure has a protruding part and that the gasket has a protruding part in such a manner that the protruding part of the gasket arranged between the circuit board and the protruding part of the shielding structure connects the floating signal line to the potential area.

11. An arrangement as claimed in claim 1, wherein the shielding structure is the frame of the electronic device.

12. An arrangement as claimed in claim 1, wherein the shielding structure is the casing of the electronic device.

13. An arrangement as claimed in claim 1, wherein the shielding structure is the gasket of the electronic device.

14. An arrangement as claimed in 1, wherein the shielding structure has at least one part protruding inward.

15. An arrangement as claimed in claim 1, wherein a second potential area is arranged on the reverse side of the circuit board.

16. An arrangement as claimed in claim 15, wherein the potential areas on opposite sides of the circuit board are connected to each other.

17. An arrangement as claimed in claim 16, wherein the potential areas are connected to each other with at least one plane block routed through the circuit board.

18. An arrangement as claimed in claim 16, wherein the potential areas on opposite sides of the circuit-board are connected to each other by means of the shielding structure of the device.

19. An arrangement as claimed in claim 1, wherein the potential area is a ground potential area.

20. A circuit board of an electronic device, which comprises at least one floating signal line routed across the circuit board and a potential area, and the floating signal line is routed at least partly at substantially the same location as the potential area in such a manner that a shielding structure of the electronic device can at an assembly stage be arranged to the circuit board so that the shielding structure connects the floating signal line to the potential area.

21. A circuit board as claimed in claim 20, wherein the floating signal line is a test signal line.

22. A circuit board as claimed in claim 20, wherein the potential area is arranged on the edge of the circuit board.

23. A circuit board as claimed in claim 20, wherein the potential area is arranged to substantially surround the entire circuit board.

24. A circuit board as claimed in claim 20, wherein the potential area has at least one cut-off point.

25. A circuit board as claimed in claim 24, wherein the floating signal line is routed through the cut-off point.

26. A circuit board as claimed in claim 20, wherein there is a second potential area on the reverse side of the circuit board.

27. A circuit board as claimed in claim 26, wherein the potential areas on opposite sides of the circuit board are connected to each other with at least one plane block routed through the circuit board.

28. A circuit board as claimed in claim 20, wherein the potential area is a ground potential area.

29. A method for implementing EMC shielding in an electronic device, the device comprising a circuit board, at least one floating signal line routed across the circuit board, a potential area on the circuit board and an electrically conductive shielding structure; in which method, the electromagnetic interference caused by the floating signal line is reduced by shielding the circuit board with an electrically conductive shielding structure by placing the shielding structure on the potential area and at least partly on the floating signal line in such a manner that the shielding structure connects the floating signal line to the potential area.

30. A method as claimed in claim 29, wherein the floating signal line and the potential area are on the same side of the circuit board.

31. A method as claimed in claim 29, wherein the potential area is on the edge of the circuit board.

32. A method as claimed in claim 29, wherein the potential area substantially surrounds the entire circuit board.

33. A method as claimed in claim 29, wherein the potential area has at least one cut-off point through which the floating signal line is routed.

34. A method as claimed in claim 29, wherein the floating signal line is a test signal line.

35. A method as claimed in claim 29, wherein the potential area is connected to a second potential area arranged on the opposite side of the circuit board.

36. A method as claimed in claim 35, wherein the potential areas on opposite sides of the circuit board are connected to each other with at least one plane block routed through the circuit board.

37. A method as claimed in claim 35, wherein the potential areas on opposite sides of the circuit board are connected to each other by means of the shielding structure of the device.

38. A method as claimed in claim 29, wherein the shielding structure is the frame of the electronic device.

39. A method as claimed in claim 29, wherein the shielding structure is the casing of the electronic device.

40. A method as claimed in claim 29, wherein the shielding structure is a gasket of the electronic device.

41. A method as claimed in claim 29, wherein the device has an electrically conductive gasket which connects the potential area to the shielding structure.

42. A method as claimed in claim 29, wherein the potential area is a ground potential area.

* * * * *